United States Patent [19]
De Loe, Jr.

[11] Patent Number: 5,603,113
[45] Date of Patent: Feb. 11, 1997

[54] AUTOMATIC GAIN CONTROL CIRCUIT FOR BOTH RECEIVER AND TRANSMITTER ADJUSTABLE AMPLIFIERS INCLUDING A LINEAR SIGNAL LEVEL DETECTOR WITH DC BLOCKING, DC ADDING, AND AC REMOVING COMPONENTS

[75] Inventor: John P. De Loe, Jr., Decatur, Ga.

[73] Assignee: Oki telecom, Suwanee, Ga.

[21] Appl. No.: 386,080

[22] Filed: Feb. 9, 1995

Related U.S. Application Data

[63] Continuation of Ser. No. 78,983, Jun. 16, 1993, abandoned.

[51] Int. Cl.[6] .................................................. H04B 7/005
[52] U.S. Cl. ................... 455/234.1; 455/84; 455/245.1; 375/345; 375/342; 330/129; 330/279
[58] Field of Search ........................... 455/234.1, 245.1, 455/250.1, 240.1, 239.1, 234.2, 84, 313, 314, 69, 70, 115, 126, 127, 245.2, 33.1; 375/345, 205; 330/129, 278, 279; 379/59

[56] References Cited

U.S. PATENT DOCUMENTS

| | | | |
|---|---|---|---|
| 2,678,998 | 1/1950 | Young, Jr. ........................... | 250/6 |
| 2,924,703 | 2/1960 | Sichak et al. ......................... | 250/6 |
| 4,261,054 | 4/1981 | Scharla-Nielsen .................... | 455/12 |
| 4,263,560 | 4/1981 | Ricker .................................. | 330/129 |
| 4,406,019 | 9/1983 | Ide et al. .............................. | 455/245 |
| 4,560,949 | 12/1985 | Young .................................. | 330/284 |
| 4,602,218 | 7/1986 | Vilmur et al. ....................... | 330/279 |
| 4,633,316 | 12/1986 | Burke et al. ......................... | 455/260 |
| 4,718,116 | 1/1988 | Jacobs et al. ........................ | 455/234.2 |
| 4,742,565 | 5/1988 | Iwahashi .............................. | 455/239.1 |
| 4,811,421 | 3/1989 | Havel et al. ......................... | 455/69 |
| 4,817,192 | 3/1989 | Phillips et al. ...................... | 455/200.1 |
| 4,817,197 | 3/1989 | Shimizu et al. ..................... | 455/314 |
| 4,884,141 | 11/1989 | Hyakutake ........................... | 455/239.1 |
| 4,958,359 | 9/1990 | Kato ..................................... | 455/69 |
| 5,020,092 | 5/1991 | Phillips et al. ...................... | 379/59 |
| 5,020,093 | 5/1991 | Pireh ................................... | 379/59 |
| 5,056,109 | 10/1991 | Gilhousen et al. ................. | 375/1 |
| 5,093,840 | 3/1992 | Schilling ............................. | 375/1 |
| 5,099,204 | 3/1992 | Weatley, III ........................ | 330/279 |
| 5,099,493 | 3/1992 | Zeger et al. ......................... | 375/1 |
| 5,103,459 | 4/1992 | Gilhousen et al. ................. | 375/1 |
| 5,107,225 | 4/1992 | Wheatley et al. ................... | 330/279 |
| 5,107,487 | 4/1992 | Vilmur et al. ....................... | 370/18 |
| 5,129,098 | 7/1992 | McGirr et al. ...................... | 455/69 |
| 5,323,425 | 6/1994 | Colamonico et al. .............. | 375/345 |
| 5,408,698 | 4/1995 | Serizawa et al. ................... | 455/240.1 |
| 5,469,471 | 11/1995 | Wheatley, III ...................... | 455/226.4 |

OTHER PUBLICATIONS

Shilling et al.—Electronic Circuits Discrete And Integrated—1989—p. 2-6.

*Primary Examiner*—Reinhard J. Eisenzopf
*Assistant Examiner*—Doris To
*Attorney, Agent, or Firm*—Louis T. Isaf, P.C.; Jeffrey R. Kuester

[57] ABSTRACT

A closed loop AGC circuit for a digital side of a dual mode cellular telephone wherein receiver and transmitter adjustable amplifiers are controlled by a linear feedback control system including a linear signal level detector which determines signal levels after a receiver baseband demodulator stage. The linear signal level detector receives a signal at an AC signal level and produces, through an averaging process, a DC received signal strength indication at a DC signal level which is linearly proportional to the AC signal level. The received signal strength indication is compared to a reference signal to produce a gain control signal which is linearly inverted and supplied as a receive gain control signal to the receiver adjustable amplifiers. The gain control signal is also combined with a transmit adjust signal received from the base station and supplied as a transmit gain control signal to the transmitter adjustable amplifiers.

10 Claims, 6 Drawing Sheets

AUTOMATIC GAIN CONTROL CIRCUIT FOR BOTH RECEIVER AND TRANSMITTER ADJUSTABLE AMPLIFIERS INCLUDING A LINEAR SIGNAL LEVEL DETECTOR WITH DC BLOCKING, DC ADDING, AND AC REMOVING COMPONENTS

This application is a continuation of application Ser. No. 08/078,983, filed on Jun. 16, 1993, now abandoned.

BACKGROUND OF THE INVENTION

The present invention relates generally to the field of telecommunications, and more specifically, to the field of automatic gain control circuits for cellular telephones.

Automatic gain control (AGC) circuits are well known in both analog cellular telephones and digital cellular telephones, including code division multiple access (CDMA) cellular telephones. It is often necessary to vary the amount of gain applied to signals received at the cellular telephone for proper analysis and processing of received signals. Such control of the gain of received signals is particularly important with digital communication methods. Particularly with CDMA systems, it is also well known to control the strength of signals transmitted from a cellular telephone in response to the strength of signals received by the cellular telephone. As received signal strengths increase, indicating closer proximity to a base station, transmission strengths are correspondingly lowered in view of the closer proximity. With closed loop systems, cellular telephones are responsive to commands received From a base station to raise or lower transmitted signal levels.

One common AGC method includes measuring a received signal level and comparing the received signal level to a reference level to control the gain applied to both receive and transmit portions of a cellular telephone. U.S. Pat. No. 5,107,225, issued to Wheatley, III et al, describes a cellular telephone which includes nonlinearly compensated adjustable amplifiers which are controlled in response to an integrator comparison between a reference signal and a received signal strength indication generated by a logarithmic detection device which receives signals before baseband demodulation. Although said to be capable of exhibiting rapid, high dynamic range signal power control, that device embodies a rather complex, expensive, and rigid method of providing a cellular telephone AGC function. There is, therefore, a need in the industry for an AGC circuit which addresses these and other related, and unrelated, problems.

SUMMARY OF THE INVENTION

Briefly described, the present invention includes, in its most preferred embodiment, a new closed loop AGC circuit for a digital side of a dual mode cellular telephone. The AGC circuit of the preferred embodiment of the present invention, in one inventive aspect, takes advantage of an understanding of actual signal strength variations within an automatic gain-controlled receiver portion of a cellular telephone. Since the degree of signal strength fluctuation at a signal strength detection point within an AGC circuit is felt to be relatively small during actual operation, the AGC circuit of the present invention is able to provide quality gain control through a system with a low level of complexity and expense.

According to the preferred embodiment of the present invention, receiver and transmitter adjustable amplifiers are controlled by a linear feedback control system including a linear signal level detector which determines signal levels after a receiver baseband demodulator stage. By analyzing post-baseband signals, as opposed to analyzing signals from earlier stages, the AGC circuit of the present invention is less rigid and better able to adapt to changes and variations in preceding components. The linear signal level detector receives a signal at an AC signal level and produces, through an averaging process, a DC received signal strength indication at a DC signal level which is linearly proportional to the AC signal level. The received signal strength indication is compared to a reference signal to produce a gain control signal which is linearly inverted and supplied as a receive gain control signal to the receiver adjustable amplifiers. The gain control signal is also combined with a transmit adjust signal received from the base station and supplied as a transmit gain control signal to the transmitter adjustable amplifiers.

It is therefore an object of the present invention to provide a new AGC circuit for a cellular telephone.

Another object of the present invention is to provide a cellular telephone AGC circuit with low complexity, cost, and rigidity.

Another object of the present invention is to provide a new closed loop AGC circuit for a digital side of a dual mode cellular telephone.

Yet another object of the present invention is to provide a dual mode cellular telephone with separate analog and digital sides which utilize independent automatic gain control circuits.

Still another object of the present invention is to provide a cellular telephone AGC circuit with a linear feedback control system.

Still another object of the present invention is to provide a cellular telephone AGC circuit with a linear signal level detector.

Still another object of the present invention is to provide a cellular telephone AGC circuit with post-baseband input.

Other objects, features and advantages of the present invention will become apparent upon reading and understanding the present specification, when taken in conjunction with the accompanying drawings.

DETAILED DESCRIPTION OF THE PREFERRED EMBODIMENT

Figure 1:
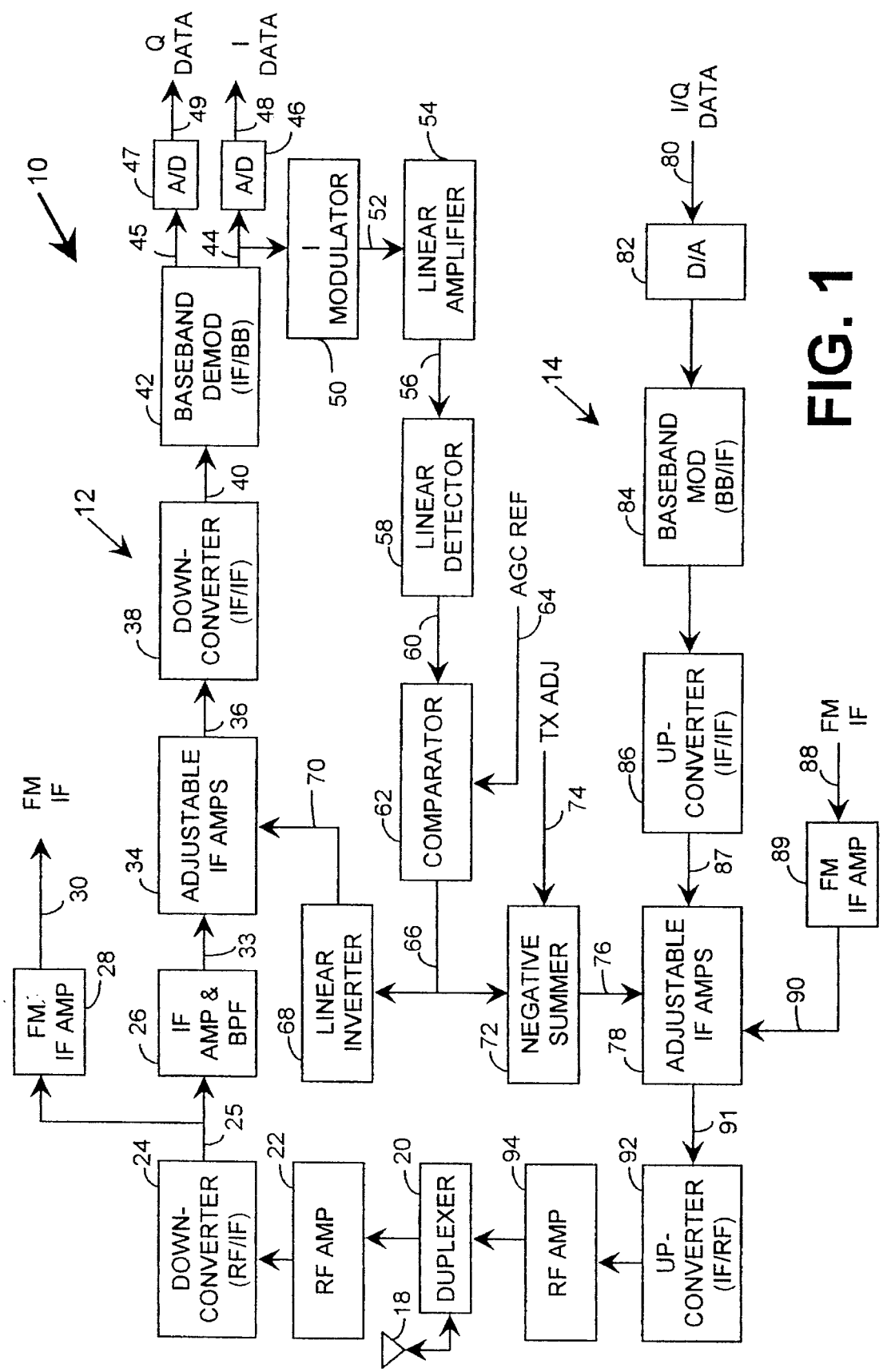
FIG. 1 is a block diagram representation of an automatic gain control circuit in accordance with the preferred embodiment of the present invention with portions of cellular receiver and transmitter sections.

Referring now in greater detail to the drawings in which like numerals represent like components throughout the several views, FIG. 1 shows an automatic gain control (AGC) circuit 10 and other components comprising a partial cellular receiver section 12 and a partial cellular transmitter section 14. An antenna 18 is connected to a duplexer 20, both of which are connected as part of the partial cellular receiver section 12 and the partial cellular transmitter section 14. The duplexer 20 is shown connected to supply radio frequency (RF) signals to a receive RF amplifier 22 in the partial cellular receiver section 12. A radio frequency-to-intermediate frequency (RF/IF) downconverter 25 is connected to the RF amp 22 to receive RF signals and output IF signals on an IF line 25. The preferred embodiment of the present invention is designed for implementation in a dual mode cellular telephone, thus both FM and code division multiple access (CDMA) digitally encoded signals are processed through the antenna 18, duplexer 20, RF amp 22, and RF/IF downconverter 24. However, after the RF/IF downconverter 24, the FM signals and the digitally encoded signals are processed along different paths. Accordingly, the IF line 25 is shown connected to two circuital blocks, an IF amplifier & band pass filter (BPF) section 26 and an FM IF amplifier 28. The FM IF amplifier 28 supplies FM IF signals along an FM IF receive line 30 to conventional FM elements of a cellular telephone (not shown), as would be understood by one reasonably skilled in the art.

The IF amplifier & BPF section 26 is shown connected through a signal input line 33 to a receiver adjustable IF amplifiers section 34. A signal output line 36 is shown supplying signals output flora the receiver adjustable IF amplifiers section 34 to an IF/IF downconverter 38. An IF line 40 couples output from the IF/IF downconverter 38 to a baseband demodulator 42. Signals flow from the baseband demodulator 42 along an I-channel baseband line 44 and a Q-channel baseband line 45 to an I-channel analog to digital (A/D) converter 46 and a Q-channel A/D converter 47, respectively. I-channel samples of digital data and Q-channel samples of digital data are output from the A/D converters 46 and 47, respectively, to digital processing elements (not shown), as would be understood by one reasonably skilled in the art.

The I-channel baseband line 44 is also shown connected to an I-channel modulator 50. A remodulated IF line 52 is shown providing output from the I-channel modulator 50 to a linear amplifier 54 from which an amplified IF line 56 provides amplified signals to a linear detector 58. A received signal strength indication (RSSI) line 60 connects the linear detector 58 to a comparator 62 which also receives input from an automatic gain control (AGC) reference line 64. A gain control signal line 66 supplies output from the comparator 62 to both a linear inverter 68 which is connected to the receiver adjustable IF amplifiers section 34 through a receive gain control signal line 70 and a negative summer 72 which also receives input from a transmitter adjustment line 74 and provides output through a transmit gain control signal line 76 to transmitter adjustable IF amplifiers 78 of the partial cellular transmitter section 14.

I/Q data lines 80 supply digital signals from digital processing elements (not shown) to digital to analog (D/A) converters 82 which supply analog signals to baseband modulator 84. An IF/IF upconverter 86 receives signals from the baseband modulator 84 and provides input to the transmitter adjustable IF amplifiers 78 through a signal input line 87. An FM IF transmit line 88 is shown providing input front conventional FM cellular components (not shown) to an FM IF transmit amplifier 89 which, through an amplified FM IF transmit line 90, provides additional input to the transmitter adjustable IF amplifiers 78. A signal output line 91 supplies signals from the transmitter adjustable IF amplifiers 78 to an IF/RF upconverter 92 which provides output to a transmit RF amplifier 94 which is connected to the duplexer 20 to transmit through the antenna 18.

Analysis of the operation of the preferred embodiment of the present invention as shown in FIG. 1, and further detailed in subsequent FIGURES, begins and ends with the antenna 18. Depending on the type of communication being used at any given time, FM or CDMA signals are received and transmitted through the antenna 18 and the duplexer 20.

When receiving signals through the antenna 18 from a base station (not shown), the duplexer 20 directs the signals to the receive RF amplifier 22 of the partial cellular receive section 12, whereas signals received from the transmit RF amplifier 94 of the partial cellular transmit section 14 are directed to the antenna 18 for transmission. Since signals received by the duplexer 20 from the transmit RF amplifier 94 are typically in a frequency range different from signals received from a base station through the antenna 18, the duplexer 20 includes a plurality or band pass and band reject filters (not shown) which assist in the duplexing function.

The receive RF amplifier 22 amplifies signals from the duplexer 20 at a predetermined gain. Elements of the receive RF amplifier 22 (not shown) include, according to the preferred embodiment of the present invention, an appropriately biased bipolar transistor, various stripline inductors, and an AC-coupled band pass filter. The RF/IF downconverter 24 converts RF signals (such as those in an exemplary range of 881 MHz, plus or minus 12 MHz) into corresponding IF signals (such as those in an exemplary range of 70 MHz, plus or minus 600 kHz for digital signals, and plus or minus 15 kHz for FM signals). Elements of the RF/IF downconverter 24 (not shown) include, according to the preferred embodiment of the present invention, a secondary frequency source, such as a voltage-controlled oscillator (VCO) for generating a receive-LO (local oscillator) frequency, in combination with a phase lock loop (PLL) to ensure proper frequency generation, and a bandpass filter, providing input to an appropriately biased bipolar transistor. Further details of construction and operation of the duplexer 20, receiver RF amplifier 22, and the RF/IF downconverter 24 would be understood by one reasonably skilled in the art. The FM IF amplifier 28 is shown amplifying FM IF signals for further conventional FM processing.

Figure 2:
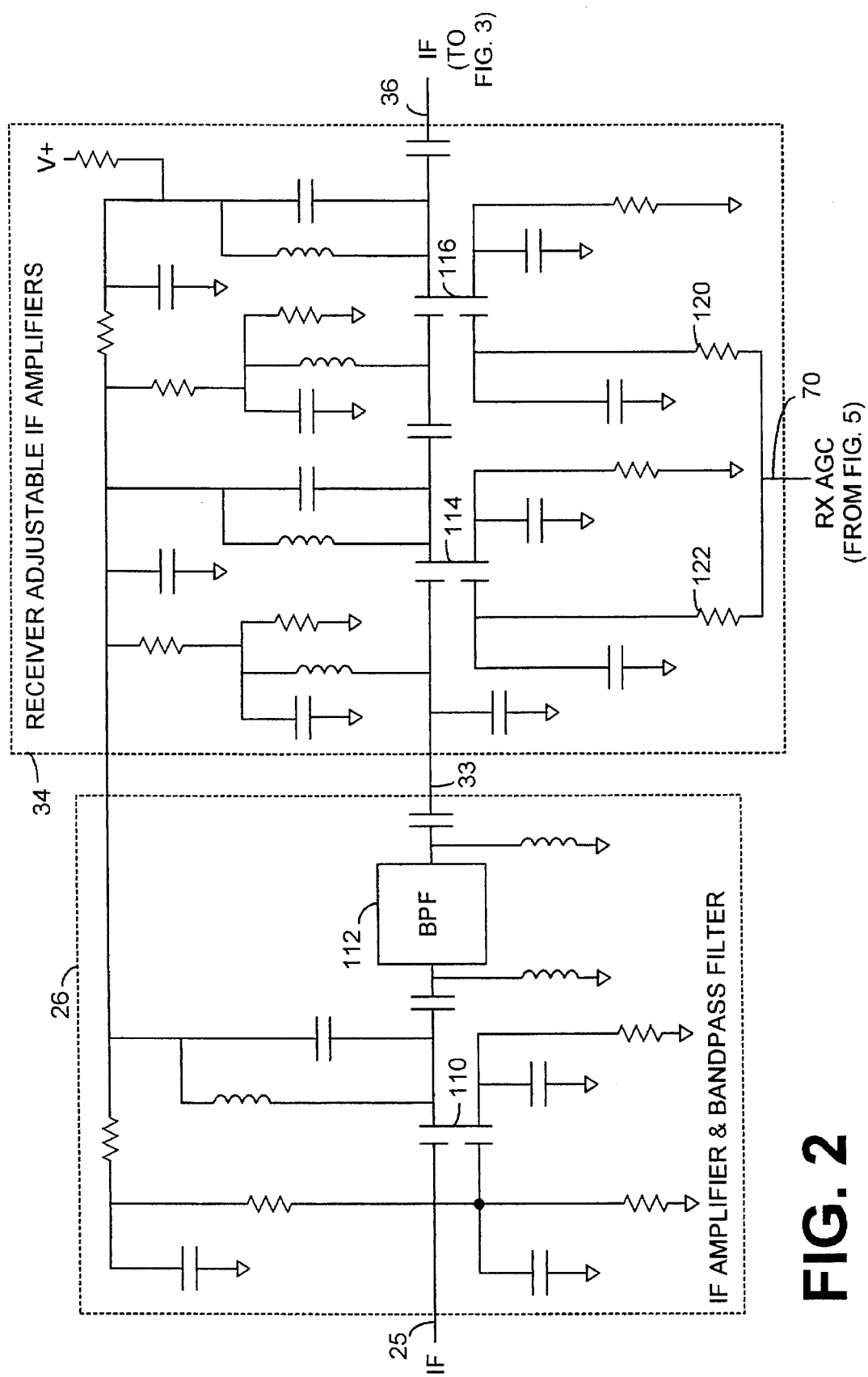
FIGS. 2–6 are schematic representations of portions of the automatic gain control circuit of FIG. 1.

The next stages in the digital side of the partial cellular receiver section 12 are the IF amplifier & BPF section 26 and the receiver adjustable IF amplifiers section 34, which are shown in greater detail in FIG. 2. The IF line 25 is shown providing input to the IF amplifier & BPF section 26 which is connected to the receiver adjustable IF amplifiers section 34 through the signal input line 33. An additional input to the receiver adjustable IF amplifiers section 34 is shown coming from FIG. 5 through the receive gain control signal line 70, and output from the receiver adjustable IF amplifiers section 34 is shown proceeding to elements of FIG. 3 through the signal output line 36. According to the preferred embodiment of the present invention, the IF amplifier & BPF section 26 includes an appropriately biased dual gate Gallium-Arsenide (GaAs) FET 110 which is AC-coupled to a surface acoustic wave (SAW) band pass filter (BPF) 112. In the preferred embodiment of the present invention, one example range of frequencies of signals on the signal input line 33 is 70 MHz, plus or minus 600 kHz.

The receiver adjustable IF amplifiers section 34 includes two AC-coupled dual gate GaAs FET's 114 and 116. One gate of each FET 114 and 116 is coupled as a signal input, and the other is coupled as a gain control input. The source of each FET 114, 116 is coupled to ground through parallel resistor, capacitor combinations, and the drain of each FET 114, 116 is coupled as a signal output. The receive gain control signal line 70 is shown connected through a resistor 120 to the gain control input gate of FET 116 and through a resistor 122 to the gain control input gate of FET 114. As the signal level on the receive gain control signal line 70 varies, as is discussed below in detail, the voltage at the gain control input gate of each FET 114, 116 varies accordingly to vary the amount of gain applied by each FET 114, 116.

Consequently, the overall gain applied by the receiver adjustable IF amplifiers section 34 to the signals on the signal input line 33 to produce the signals on the signal output line 36 is controlled by the receive gain control signal line 70.

Figure 3:
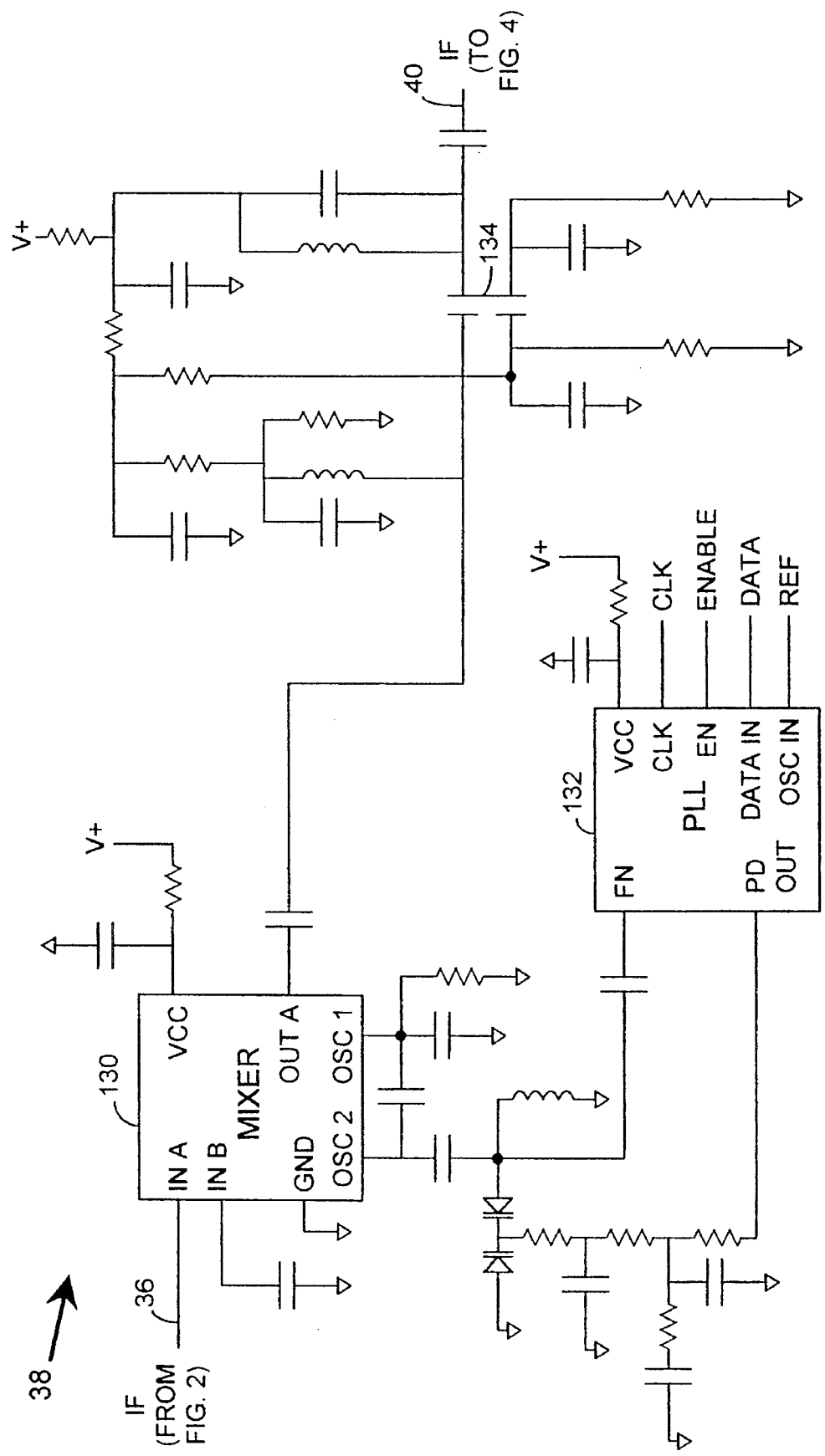

Referring briefly back to FIG. 1, the signal output line 36 is shown connecting the receiver adjustable IF amplifiers section 34 to the IF/IF downconverter 38 which converts the signals receive on the signal output line 36 to corresponding signals at a different intermediate frequency on IF line 40. With reference to FIG. 3, the IF/IF downconverter 38 is shown in greater detail. A mixer 130 is shown connected through configuring components to a phase lock loop (PLL) 132. One example of an acceptable mixer 130 is the SA602A from Signetics Corporation of Sunnyvale, Calif., and one example of an acceptable PLL 132 is the MC145170 from Motorola, Inc. of Schaumburg, Ill.. The PLL 132 continuously re-tunes the mixer 130 which mixes the IF signals on signal output line 36 with a second receiver-LO signal to output signals with, in accordance with the preferred embodiment of the present invention, a median frequency of 4.95 MHz. Another GaAs FET 134 with appropriate biasing elements is AC-coupled to the output of the mixer 130 to provide any necessary gain at a constant level to the signals output from the mixer 130. The IF line 40 is AC-coupled to the output of the GaAs FET 134.

Figure 4:
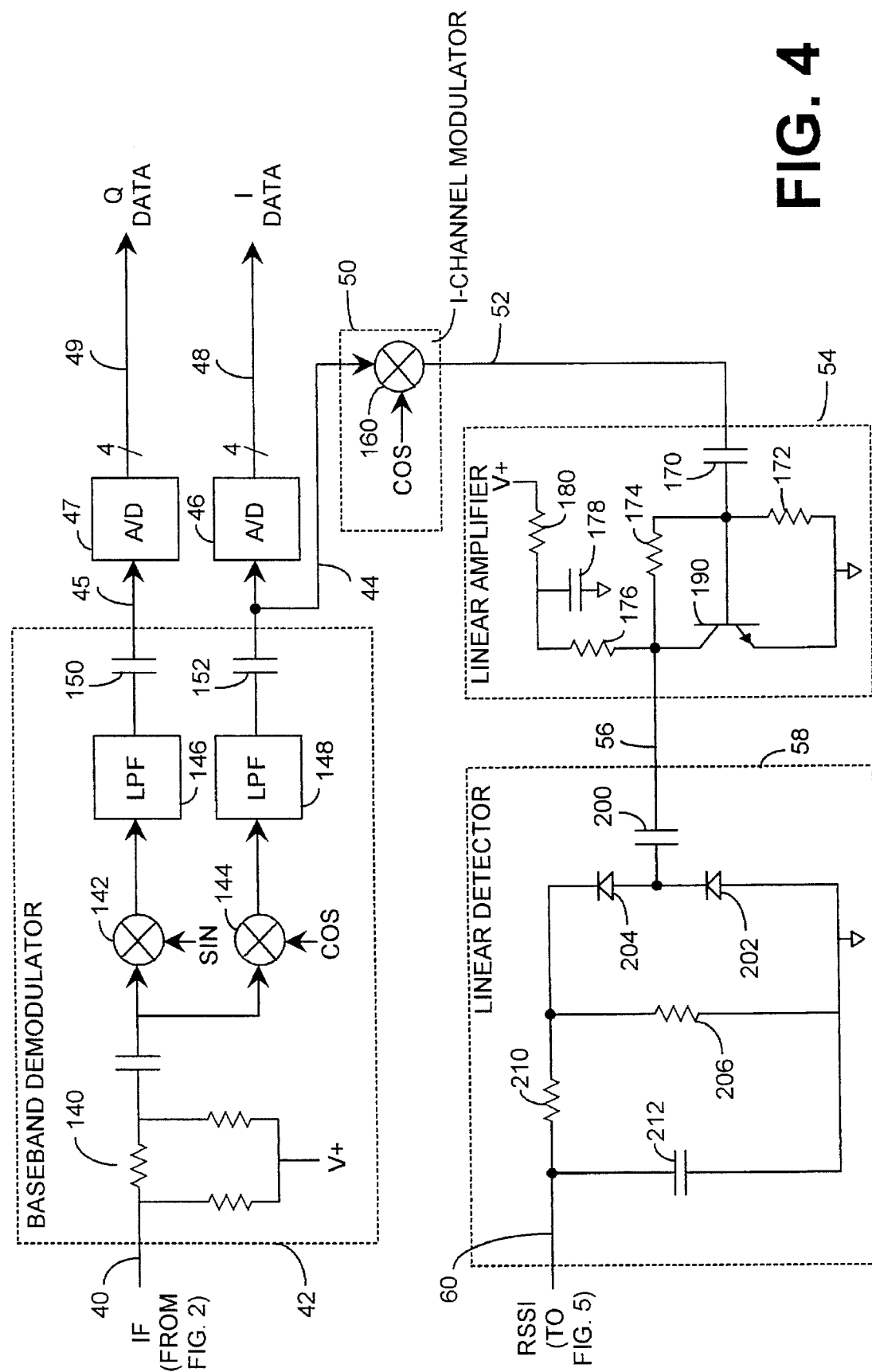

Referring again briefly to FIG. 1, the IF line 40 connects the IF/IF downconverter 38 to the baseband demodulator 42. As discussed above, signals flow from the baseband demodulator 42 through the A/D converters 46, 47 and, in part, through the I-channel modulator 50, the linear amplifier 54, and the linear detector 58. Refer now to FIG. 4, which shows the baseband demodulator 42, the I-channel modulator 50, the linear amplifier 54, and the linear detector 58 in greater detail. Signals on the IF line 40 flow through an AC-coupled attenuating resistor network 140 and then into parallel mixer lines headed by a Q-channel mixer 142 followed by a low pass filter (LPF) 146, and an I-channel mixer 144 followed by a low pass filter (LPF) 148. The baseband signals from the LPF's 148, 146 are AC-coupled through capacitors 152, 150, respectively, to A/D converters 46, 47, respectively. Digital signals are then supplied to digital processing elements (not shown) through receive I-channel data lines 48 and receive Q-channel data lines 49. The I-channel baseband line 44 is shown also connected to the I-channel modulator 50, shown including an I-channel mixer 160. Although indicated as separate elements, one example of an acceptable device comprising the Q-channel fixer 142, I-channel mixer 144, LPF's 146, 148, A/D converters 46, 47, and I-channel modulator 50 is the CDMA Baseband Analog ASIC (application specific integrated circuit) available from Qualcomm, Inc. of San Diego, Calif. In other embodiments of the present invention, individual components are used, and in others, the I-channel modulator 50 is omitted such that the I-channel baseband line 44 is connected directly to the linear amplifier 54.

Signals received along the remodulated IF line 52 are linearly amplified by the linear amplifier 54. A capacitor 170 blocks any DC in signals on the remodulated IF line 52. Biasing elements 172, 174, 176, 178, and 180 are sized to bias a bipolar transistor 190 in the active amplification region so that a constant amount of gain is applied between the base and the collector of the bipolar transistor 190 which is connected to the amplified IF line 56. One example of an acceptable bipolar transistor is the BC848 from Motorola, Inc. Thus, the term "linear amplification" is understood to refer to amplification which is linear, rather than logarithmic, etc., over a given range of input values.

The amplified IF line 56 connects the linear amplifier 54 to the linear detector 58. The amplified IF line 56 is connected to a capacitor 200 which is further connected to the cathode of a diode 202 with a grounded anode and to the anode of diode 204. The cathode of the diode 204 is connected to a grounded resistor 206 and a resistor 210 which is connected to the RSSI line 60. A grounded capacitor 212 is also connected to the RSSI line 60. In general, the linear detector 58 receives signals at AC signal levels on the amplified IF line 56 and outputs DC signals on the RSSI line 60 with DC levels which are linearly proportional to the AC signal levels.

Typically, a signal travelling over amplified IF line 56 has an AC and a DC component. Since capacitor 200 is connected in series (AC-coupled) with the remainder of the linear detector 58, capacitor 200 remove the DC component from the signal supplied from the amplified IF line 56. The capacitor 200 also cooperates with the diodes 202, 204 to add a new DC level to the AC component which is linearly proportional to the incoming AC signal level. As the AC signal level rises, the capacitor 200 is charged, and when the AC signal level falls, the diode 202 turns on, resulting in an upward voltage shift. Resistor 210 and capacitor 212 function as a low pass filter to remove the remaining AC component to leave a DC signal which is linearly proportional to the AC signal level of the signal on the amplified IF line 56. In addition, the resistor 210 functions as an averaging means to slow the charge of capacitor 212 so that the output on the RSSI line 60 is an averaged linear output. The resistors 206 and 210 are, in the preferred embodiment of the present invention, approximately equal in value.

Figure 5:
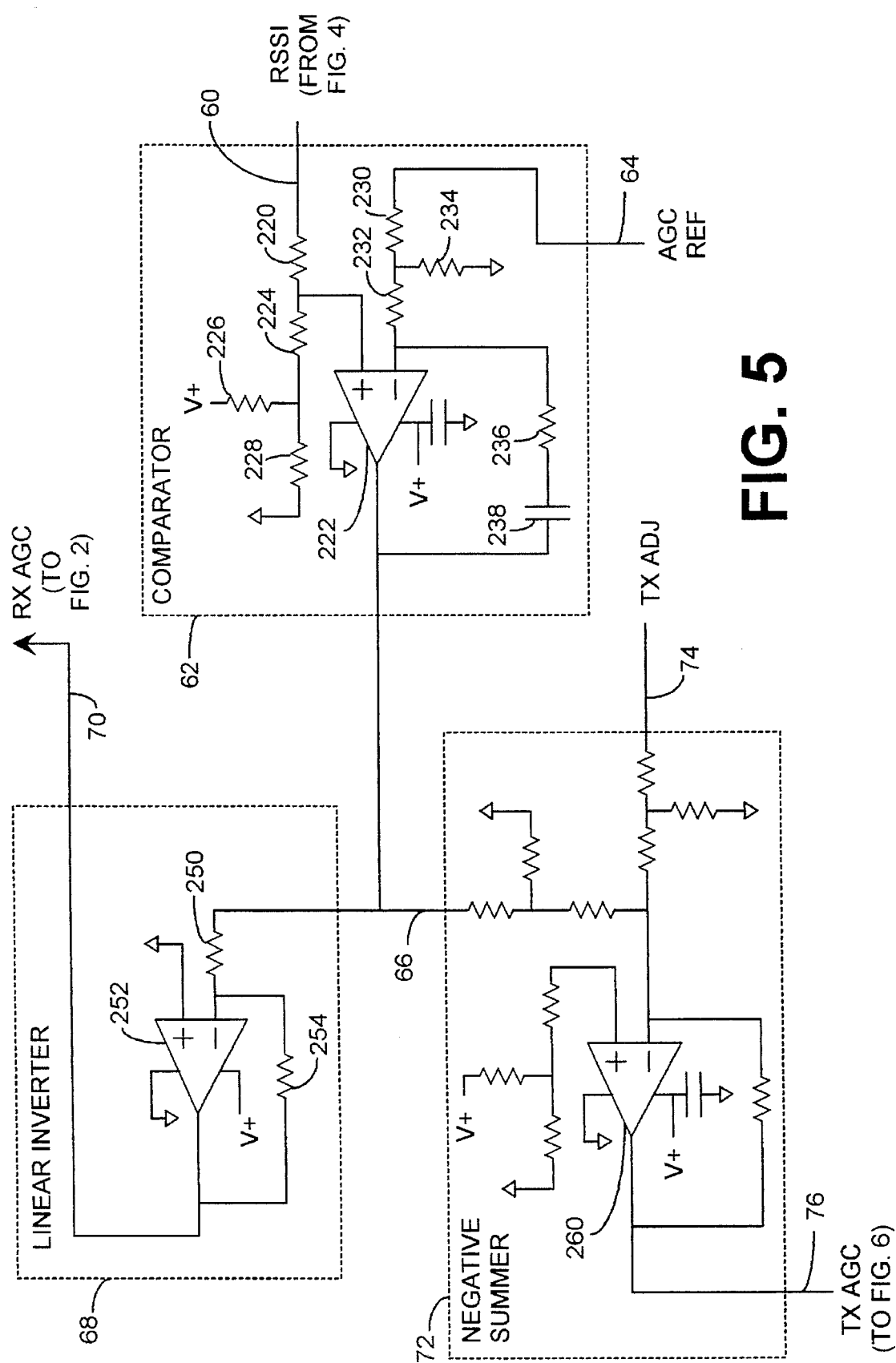

Referring again briefly to FIG. 1, the RSSI line 60 is shown connecting the linear detector 58 to the comparator 60, which also receives input from the AGC REF line 64 and provides output along gain control signal line 66. Gain control signal line 66 is shown providing input to the linear inverter 68 which provides output along the receive gain control signal line 70, and further providing input, along with the TX ADJ line 74, to the negative summer 72 which provides output along the transmit gain control signal line 76. Refer now to FIG. 5, which shows these elements in greater detail. The RSSI line 60 is shown supplying signals through a biasing resistor 220 to the non-inverting input of an operational amplifier (op amp) 222, which input is also connected to biasing resistors 224, 226, and 228. The AGC REF (automatic gain control reference) line 64, which is connected to elements (not shown) which generate a desired reference signal level, is shown providing signals through a network of biasing resistors 230, 232 and 234 to the inverting input of op amp 222. The output and inverting input of the op amp 222 is shown connected through resistor 236 and capacitor 238 so that the op amp 222 functions as an open loop integrator to produce a gain control signal on the gain control signal line 66 equal to the difference between the signal levels on the RSSI line 60 and the AGC REF line 64.

The linear inverter 68 is shown receiving the gain control signal line 66 and providing output through the receive gain control signal line 70. The gain control signal line 66 is shown connected through a resistor 250 to the inverting input of an op amp 252. A resistor 254 is shown connected between the output and inverting input of the op amp 252, whereas the non-inverting input of the op amp 252 is grounded. Thus, the op amp 252 functions as an inverting amplifier operating in a linear manner without undue complexity. The negative summer 72 is shown receiving signals on the gain control signal line 66 and the TX ADJ (transmit adjust) line 74, and producing output on the transmit gain control signal line 76. The gain control signal line 66 and the TX ADJ line 74 are, after various resistors, connected together at the inverting input of an op amp 260 which is biased to amplify and invert the sum of the two input signals and provide output on the transmit gain control signal line 76.

Referring again to FIG. 1, after the I/Q data signals are converted from digital signals into analog signals by the D/A converters 82, modulated into intermediate frequencies by the baseband modulator 84, and upconverted into a higher intermediate frequency by the IF/IF upconverter 86, the transmit signals are provided to the transmitter adjustable IF amplifiers section 78 through the signal input line 87. Although not shown, the D/A converters 82 and baseband modulator 84 include I-channel and Q-channel elements handling each channel separately in a manner similar to the partial cellular receiver section 12. FM signals are also provided to the transmitter adjustable IF amplifiers section 78 through the amplified FM IF transmit line 90 after being amplified by the FM IF amplifier 89. After being amplified by the transmitter adjustable IF amplifiers section 78, signals (either FM or CDMA) are transmitted along the signal output line 91 to the IF/RF upconverter 92 which converts the IF signals to corresponding RF signals which are then amplified by the RF amp 94 and provided to the duplexer 20 for transmission on the antenna 18, as discussed above.

Figure 6:
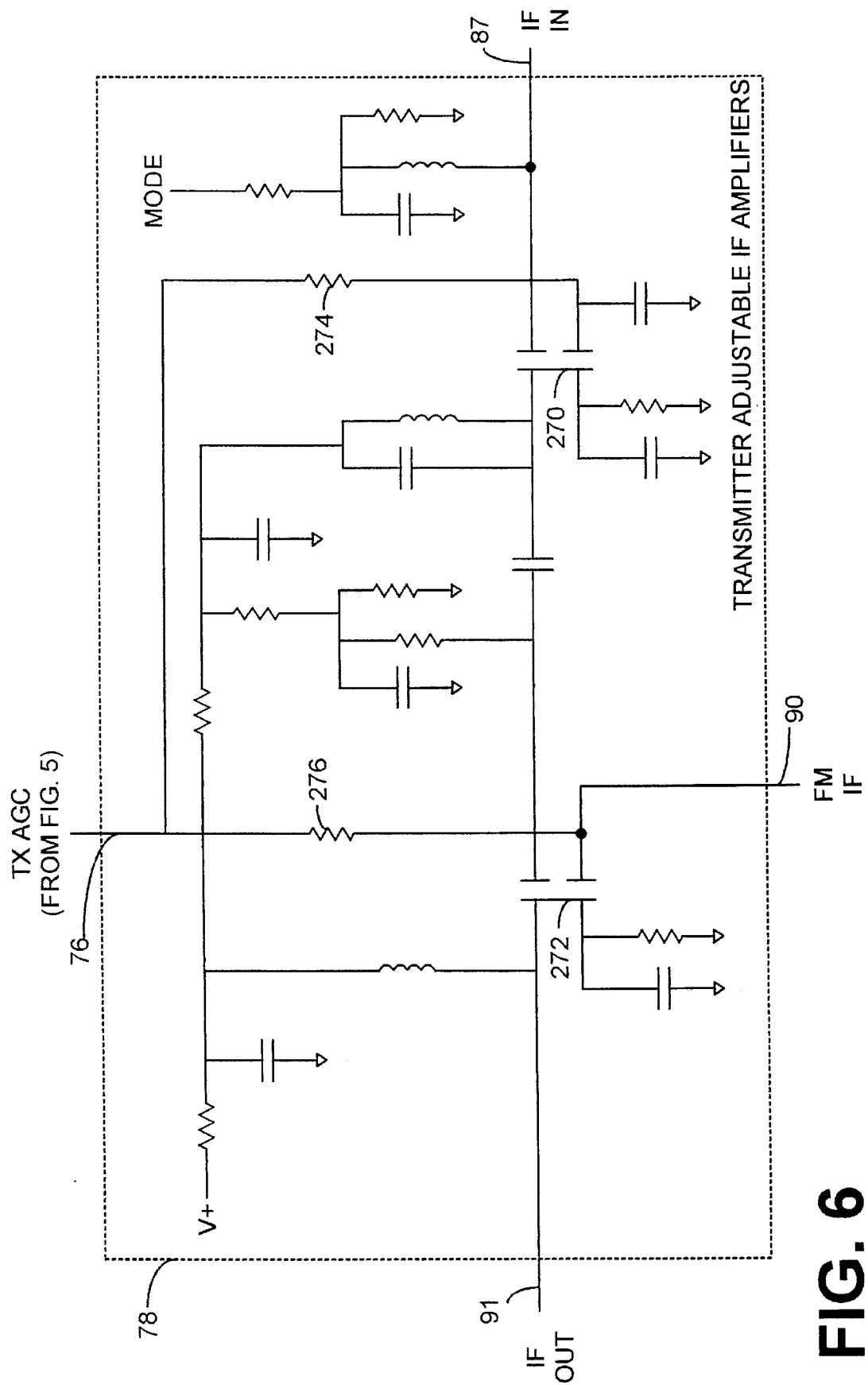

Referring now to FIG. 6, which shows the transmitter adjustable IF amplifiers section 78 in greater detail, the signal input line 87 is connected to one gate of a dual gate GaAs FET 270, whose output is coupled to one gate of another dual gate GaAs FET 272, whose output is connected to the signal output line 91. The other gate of the dual gate GaAs FET 270 is connected through a resistor 274 to the transmit gain control signal line 76 which is also connected through a resistor 276 to the other gate of the dual gate GaAs FET 272. When functioning in a CDMA mode, the FET's 270 and 272 function in a manner similar to the FET's 114, 116 of FIG. 2 of the receiver adjustable IF amplifiers section 34 in that the gain applied between the signal input line 87 and the signal output line 91 is adjusted according to levels on the transmit gain control signal line 76. When FM signals are being amplified by the transmitter adjustable IF amplifiers section 78, a mode voltage effectively disables the first FET 270, and the signals on the amplified FM IF transmit line 90 override those from the transmit gain control signal line 76 so that the second FET 272 amplifies the FM IF signals by a constant gain.

While the embodiments of the present invention which have been disclosed herein are the preferred forms, other embodiments of the present invention will suggest themselves to persons skilled in the art in view of this disclosure. Therefore, it will be understood that variations and modifications can be effected within the spirit and scope of the invention and that the scope of the present invention should only be limited by the claims below.

We claim:

1. A code division multiple access (CDMA) automatic gain control circuit for a CDMA cellular telephone, said circuit comprising:

a CDMA adjustable receiver amplifier including a gain control input, a signal input, and a signal output;

a CDMA adjustable transmitter amplifier including a gain control input, a signal input, and a signal output; and a CDMA linear feedback control system including a linear, non-logarithmic signal level detector including an input and an output, wherein said input of said linear, non-logarithmic signal level detector is coupled to said signal output of said CDMA adjustable receiver amplifier, wherein said linear, non-logarithmic signal level detector includes means for, upon receiving an input signal with an alternating current (AC) component and a direct current (DC) component, blocking the DC component of the input signal to leave only the AC component of the input signal, means connected to said blocking means for adding to said input signal a second DC component linearly proportionate to said AC component to produce a shifted signal having the second DC component and an AC component similar to the AC component of the input signal, and means connected to said adding means for receiving said shifted signal and for removing said AC component of the shifted signal to produce a detector output signal including substantially only the second DC component; and a comparator including a detection input, a reference input for receiving a reference signal, and an output, wherein said detection input of said comparator is coupled to said output of said linear signal level detector, and wherein said output of said comparator is coupled to said gain control input of said CDMA adjustable receiver amplifier and said gain control input of said CDMA adjustable transmitter amplifier.

2. The circuit of claim 1, wherein said CDMA linear feedback control system further includes a linear inverter interposed between said comparator and said CDMA adjustable receiver amplifier including an input and an output, wherein said input of said linear inverter is coupled to said output of said comparator, and wherein said output of said linear inverter is coupled to said gain control input of said CDMA adjustable receiver amplifier.

3. The circuit of claim 1, wherein said CDMA linear feedback control system further includes a negative summer interposed between said comparator and said CDMA adjustable transmitter amplifier including a first input, a second input, and an output, wherein said first input of said negative summer is coupled to said output of said comparator, wherein said second input receives a transmitter adjustment signal, and wherein said output of said negative summer is coupled to said gain control input of said CDMA adjustable transmitter amplifier.

4. The circuit of claim 1, wherein said CDMA adjustable transmitter amplifier is an intermediate frequency CDMA adjustable amplifier.

5. The circuit of claim 1, wherein said blocking means includes a capacitor connected in series to said input of said linear signal level detector, wherein said adding means includes diode means for adding voltage and half-wave rectifying, and wherein said removing means includes an averaging low pass filter including an averaging resistor connected in series with said adding means.

6. An automatic gain control circuit comprising:

an intermediate frequency adjustable amplifier including a gain control input, a signal input, and a signal output;

a baseband demodulator including an input and an output, wherein said input of said baseband demodulator is coupled to said signal output of said adjustable amplifier;

an intermediate frequency downconverter interposed between said adjustable amplifier and said baseband demodulator, wherein said intermediate frequency downconverter includes an input and an output, wherein said input of said intermediate frequency downconverter is coupled to said output of said adjustable amplifier, wherein said output of said intermediate frequency downconverter is coupled to said input of said baseband demodulator; and a feedback control system coupled between said output of said baseband demodulator and said gain control input of said adjustable amplifier, wherein said feedback control system includes a linear, non-logarithmic signal level detector including
an input and an output, wherein said input of said signal level detector is coupled to said output of said baseband demodulator,
means for, upon receiving an input signal with an alternating current (AC) component and a direct current (DC) component, blocking the DC component of the input signal to leave only the AC component of the input signal,
means connected to said blocking means for adding to said input signal a second DC component linearly proportionate to said AC component to produce a shifted signal having the second DC component and an AC component similar to the AC component of the input signal, and
means connected to said adding means for receiving said shifted signal and for removing said AC component of the shifted signal to produce a detector output signal including substantially only the second DC components, a comparator including a detection input, a reference input for receiving a reference signal, and a output, wherein said detection input of said comparator is coupled to said output of said signal level detector, and an inverter including an input and an output, wherein said input of said inverter is coupled to said output of said comparator, and wherein said output of said inverter is coupled to said gain control input of said adjustable amplifier.

7. An automatic gain control circuit comprising:

an adjustable receiver amplifier including a gain control input, a signal input, and a signal output;

a baseband demodulator including an input and an output, wherein said input of said baseband demodulator is coupled to said signal output of said adjustable receiver amplifier;

a feedback control system coupled between said output of said baseband demodulator and said gain control input of said adjustable receiver amplifier, wherein said feedback control system includes a signal level detector including an input and an output, wherein said input of said signal level detector is coupled to said output of said baseband demodulator, a comparator including a detection input, a reference input for receiving a reference signal, and an output, wherein said detection input of said comparator is coupled to said output of said signal level detector, and an inverter including an input and an output, wherein said input of said inverter is coupled to said output of said comparator, and wherein said output of said inverter is coupled to said gain control input of said adjustable receiver amplifier;

a negative summer including a first input, a second input, and an output, wherein said first input of said negative summer is coupled to said output of said comparator, wherein said second input receives a transmitter adjustment signal; and an adjustable transmitter amplifier including a gain control input, a signal input, and a signal output, wherein said gain control input is coupled to said output of said negative summer.

8. In an automatic gain control circuit including an adjustable amplifier including a gain control input, a signal input, and a signal output, a baseband demodulator including an input and an output, wherein said input of said baseband demodulator is coupled to said signal output of said adjustable amplifier, and a feedback control system coupled between said output of said baseband demodulator and said gain control input of said adjustable amplifier, wherein said feedback control system includes an amplifier including an input and an output, wherein said input of said amplifier is coupled to said output of said baseband demodulator, a signal level detector including
an input and an output, wherein said input of said signal level detector is coupled to said output of said amplifier,
means for, upon receiving an input signal with an alternating current (AC) component and a direct current (DC) component, blocking the DC component of the input signal to leave only the AC component of the input signal,
means connected to said blocking means for adding to said input signal a second DC component linearly proportionate to said AC component to produce a shifted signal having the second DC component and an AC component similar to the AC component of the input signal, and
means connected to said adding means for receiving said shifted signal and for removing said AC component of the shifted signal to produce a detector output signal including substantially only the second DC component, a comparator including a detection input, a reference input for receiving a reference signal, and output, wherein said detection input of said comparator is coupled to said output of said signal level detector, and an inverter including an input and an output, wherein said input of said inverter is coupled to said output of said comparator, and wherein said output of said inverter is coupled to said gain control input of said adjustable amplifier, the improvement thereto comprising:

wherein said amplifier is a linear amplifier; and wherein said signal level detector is a linear, non-logarithmic signal level detector.

9. A code division multiple access (CDMA) automatic gain control circuit comprising:

a CDMA intermediate frequency adjustable transmitter amplifier including a gain control input, a signal input, and signal output;

a CDMA intermediate frequency adjustable receiver amplifier including a gain control input, a signal input, and a signal output;

a CDMA baseband demodulator including an input and an output, wherein said input of said CDMA baseband demodulator is coupled to said signal output of said CDMA intermediate frequency adjustable receiver amplifier;

an intermediate frequency downconverter interposed between said CDMA intermediate frequency adjustable receiver amplifier and said CDMA baseband demodulator, wherein said intermediate frequency downconverter includes an input and an output, wherein said input of said intermediate frequency downconverter is coupled to said output of said CDMA intermediate frequency adjustable receiver amplifier, wherein said output of said intermediate frequency downconverter is coupled to said input of said CDMA baseband demodulator;

a negative summer interposed between said comparator and said CDMA intermediate frequency adjustable transmitter amplifier, wherein said negative summer includes a first input, a second input, and an output, wherein said first input of said negative summer is coupled to said output of said comparator, wherein said second input receives a transmitter adjustment signal, and wherein said output is coupled to said gain control input of said CDMA intermediate frequency adjustable transmitter amplifier; and a CDMA feedback control system coupled between said output of said CDMA baseband demodulator and both said gain control input of said CDMA intermediate frequency adjustable transmitter amplifier and said gain control input of said CDMA intermediate frequency adjustable receiver amplifier, wherein said feedback control system includes a signal level detector including an input and an output, wherein said input of said signal level detector is coupled to said output of said CDMA baseband demodulator, a comparator including a detection input, a reference input for receiving a reference signal, and an output, wherein said detection input of said comparator is coupled to said output of said signal level detector, and wherein said output of said comparator is coupled to both said gain control input of said CDMA intermediate frequency adjustable transmitter amplifier and said gain control input of said CDMA intermediate frequency adjustable receiver amplifier, a linear amplifier interposed between said CDMA baseband demodulator and said signal level detector, wherein said linear amplifier includes an input and an output, wherein said input of said linear amplifier is coupled to said output of said CDMA baseband demodulator, and wherein said output of said linear amplifier is coupled to said input of said signal level detector, and a linear inverter interposed between said comparator and said CDMA intermediate frequency adjustable receiver amplifier, wherein said linear inverter includes an input and an output, wherein said input of said linear inverter is coupled to said output of said comparator, and wherein said output of said linear inverter is coupled to said gain control input of said CDMA intermediate frequency adjustable receiver amplifier;

wherein said signal level detector is a linear, non-logarithmic signal level detector and includes means for, upon receiving an input signal with an alternating current (AC) component and a direct current (DC) component, blocking the DC component of the input signal to leave only the AC component of the input signal, means connected to said blocking means for adding to said input signal a second DC component linearly proportionate to said AC component to produce a shifted signal having the second DC component and an AC component similar to the AC component of the input signal, and means connected to said adding means for receiving said shifted signal and for removing said AC component of the shifted signal to produce a detector output signal including substantially only the second DC component.

10. The circuit of claim 9, wherein said blocking means includes a capacitor connected in series to said input of said linear signal level detector, wherein said adding means includes diode means for adding voltage and half-wave rectifying, and wherein said removing means includes an averaging low pass filter including an averaging resistor connected in series with said adding means.

* * * * *